(12) United States Patent
Chueh et al.

(10) Patent No.: US 8,420,185 B1
(45) Date of Patent: Apr. 16, 2013

(54) METHOD FOR FORMING METAL FILM WITH TWINS (75) Inventors: Yu-Lun Chueh, Hsinchu (TW); Tsung-Cheng Chan, Hsinchu (TW); Chien-Neng Liao, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 13/550,789

(22) Filed: Jul. 17, 2012

(30) Foreign Application Priority Data

Oct. 11, 2011 (TW) .............................. 100136726 A (51) Int. Cl.
  *B05D 3/00* (2006.01)
  *C23C 14/14* (2006.01)
  *C21D 6/04* (2006.01)
  *C21D 1/09* (2006.01)

(52) U.S. Cl.
  USPC ............ 427/551; 427/596; 148/517; 148/525

(58) Field of Classification Search .................... None
See application file for complete search history.

(56) References Cited

PUBLICATIONS

Cole, James I., "Post-irradiation deformation chracteristcs of heavy-ion irradiated 304L SS", Journal of Nuclear Materials, 225 (1995) 53-58.*
Bullough, T.J., "Low-Energy Heavy-Ion Irradiations of Copper and Molybdenum at Low Temperatures", Proc. R. Soc. Lond. A 1991 435.*
Meinander, K. "Irradiation-induced densification of cluster-assembled thin films", Physical Review B 79, 045411 (2009).*

* cited by examiner

*Primary Examiner* — Timothy Meeks
*Assistant Examiner* — Ina Agaj
(74) *Attorney, Agent, or Firm* — Birch, Stewart, Kolasch & Birch, LLP

(57) ABSTRACT

A method for forming a metal film with twins is disclosed. The method includes: (a) forming a metal film over a substrate, the metal film being made of a material having one of a face-centered cubic crystal structure and a hexagonal close-packed crystal structure; and (b) ion bombarding the metal film at a film temperature lower than −20° C. in a vacuum chamber and with an ion-bombarding energy sufficient to cause plastic deformation of the metal film to generate deformation twins in the metal film.

8 Claims, 10 Drawing Sheets

METHOD FOR FORMING METAL FILM WITH TWINS

CROSS-REFERENCE TO RELATED APPLICATION

This application claims priority of Taiwanese application no. 100136726, filed on Oct. 11, 2011.

BACKGROUND OF THE INVENTION

1. Field of the Invention

This invention relates to a method for forming a metal film, and more particularly to a method for forming a metal film with twins.

2. Description of the Related Art

It is well known to persons having ordinary skill in the art of metallurgy that, after a metal material is applied with a shear stress through a cold working procedure, line defects in the metal material, such as dislocations, may be moved by virtue of slip system in the metal material itself. The moved dislocations may become entangled with one another. The application of cold working also increases planar defects in the metal material, such as twins. The tangled dislocations and the planar defects enhance mechanical strength of the metal material, such as hardness. However, the abovementioned cold working procedure is limited for application only to bulks, and is not suitable for a thin metal film.

In recent years, to enhance the strength of a metal film in order to expand the applicability of the metal film, growth twins have attracted much attention in the field of thin film processing. It has been recognized that the smaller the twin spacing of growth twins, the greater the mechanical strength will be. The theory and mechanism behind this result are similar to those of grain size strengthening. That is, fineness of grains facilitates enhancement of the mechanical strength of the metal material.

In an article entitled "High-strength sputter-deposited copper foils with preferred orientation of nanoscale growth twins" in APPLIED PHYSICS LETTERS 88, 173116 (2006), X. Zang et al disclosed magnetron sputtering copper at a deposition rate of 0.5 nm/s to 2.0 nm/s to produce a 20 μm copper foil on a Si (100) substrate with a native oxide layer. No heating or cooling was applied to the Si substrate during the formation of the copper foil.

Analytic results of the copper foil using transmission electron microscope (TEM) indicate that the copper foil sputter-deposited at a rate of 1.8 nm/s has columnar grains with an average size of 43 nm. The TEM results also show an extremely high density of planar defects within the columnar grains. Also, analytic results of the copper foil using high resolution transmission electron microscope (HRTEM) indicate that the planar defects are growth twins with {111} interfaces. The spacing between two adjacent twins is approximately 5 nm, and the planar defects of {111} twin interfaces are stacked along the growth direction of the copper foil. This confirms that the planar defects are stacking faults (SF) within the copper foil. In other words, the twins in the copper foil resulted from the stacking faults of the close-packed plane of the copper foil.

In addition, five uniaxial tensile tests were performed on the copper foils. The results indicate that the average elastic modulus, the average tensile strength, and the average yield strength of the copper foils are approximately 110 GPa, 1.2 GPa and 1.1 GPa, respectively. Further, the hardness of the copper foil, as measured by a nanoindenter, was 3.5 GPa.

In an article entitled "Microstructural stability during cyclic loading of multilayer copper/copper samples with nanoscale twinning" in Scripta Materialia (2009) 1073-1077, C. J. Shute et al disclosed sputtering of copper using magnetron sputtering deposition technique to produce a 178 μm copper multilayer film on a Si (100) substrate. The thickness of the copper multilayer film is sufficient to allow the copper multilayer film to be removed from the Si (100) substrate.

The copper multilayer film has a mirror-like surface that is in contact with the Si (100) substrate, and a dull surface that is opposite to the mirror-like surface. A Vickers hardness measurement was conducted on the copper multilayer film. The result indicates that the hardness of the mirror-like surface and the dull surface are 1.1 GPa and 1.9 GPa, respectively. In addition, an analysis of the copper multilayer film was performed by means of a focus ion beam (FIB) microscope. The results indicate that the structure of the copper multilayer film changes from a non-columnar microstructure to a nanotwinned columnar microstructure from the mirror-like surface to the dull surface.

From the above, it is found that, when a metal film with twins are formed using magnetron sputtering deposition technique, a predetermined deposition thickness is required to convert the microstructure of the metal film into a twin structure. For a copper wire that is widely used in a semiconductor device, the thickness of the copper wire is required to be in the range from about 300 nm to about 400 nm. Therefore, the methods for forming a metal film with twins disclosed by C. J. Shute et al and C. Zang et al are not suitable for the nano-scale copper wire that is used in the semiconductor field.

SUMMARY OF THE INVENTION

Therefore, the object of the present invention is to provide a method for forming a metal film with twins, that is suitable for use in the semiconductor field.

According to this invention, a method for forming a metal film with twins comprises:

(a) forming a metal film over a substrate, the metal film being made of a material having one of a face-centered cubic crystal structure and a hexagonal close-packed crystal structure; and (b) ion bombarding the metal film at a film temperature lower than −20° C. in a vacuum chamber and with an ion-bombarding energy sufficient to cause plastic deformation of the metal film to generate deformation twins in the metal film.

BRIEF DESCRIPTION OF THE DRAWINGS

Other features and advantages of the present invention will become apparent in the following detailed description of the preferred embodiment of the invention, with reference to the accompanying drawings, in which:

FIG. 5 is a transmission electron microscope image illustrating a microstructure of a first copper layer in Example 1

(E1) of the preferred embodiment of a method for forming a metal film with twins according to the present invention;

DETAILED DESCRIPTION OF THE PREFERRED EMBODIMENT

Figure 1:
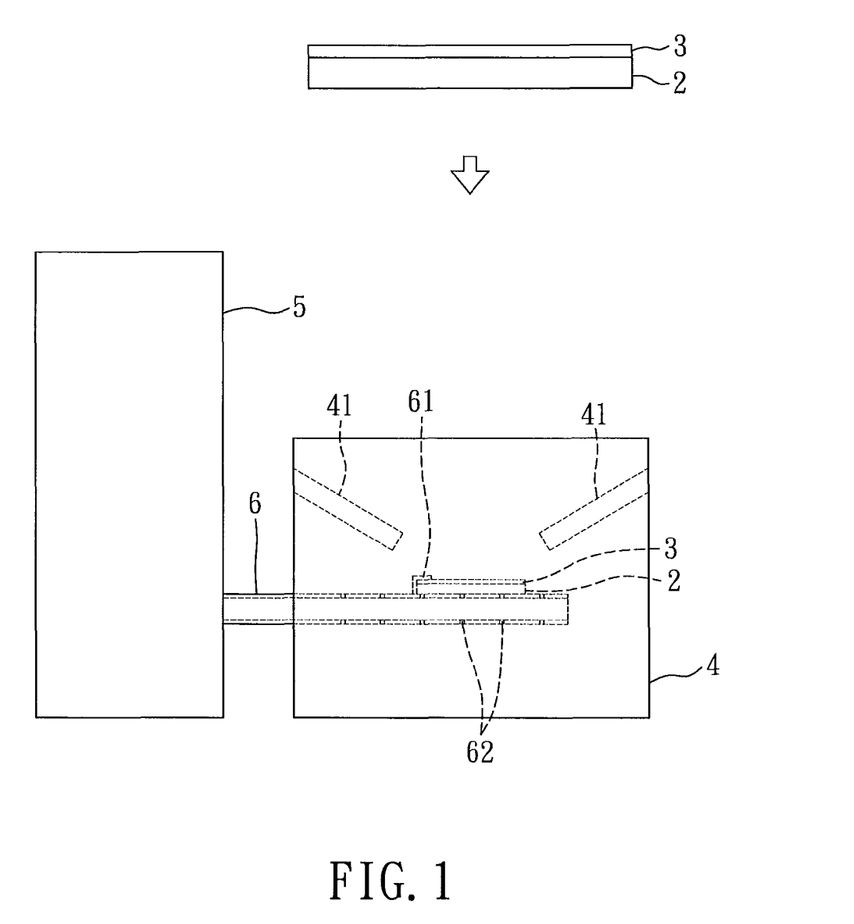
FIG. 1 shows consecutive steps of the preferred embodiment of a method for forming a metal film with twins according to the present invention.

Referring to FIG. 1, the preferred embodiment of a method for forming a metal film with twins according to the present invention comprises:

(a) forming a metal film 3 over a substrate 2, the metal film 3 being made of a material having one of a face-centered cubic crystal structure and a hexagonal close-packed crystal structure; and (b) ion bombarding the metal film 3 at a film temperature lower than −20° C. in a vacuum chamber 4 and with an ion-bombarding energy sufficient to cause plastic deformation of the metal film 3 to generate deformation twins in the metal film 3.

The ion-bombarding energy is sufficient to provide the metal film 3 with a strain energy that is higher than a stacking fault energy of the metal film 3 such that the metal film 3 undergoes plastic deformation to generate deformation twins.

The ion bombarding of this embodiment is achieved by bombarding the metal film 3 with the ion beams generated by two ion guns 41 that are disposed respectively in the vacuum chamber 4, thereby providing stress to the metal film 3. In addition, since the face-centered cubic crystal structure and the hexagonal close-packed crystal structure have both close-packed planes, once an error of the stacking sequence (i.e., the stacking fault) of the close-packed planes in the face-centered cubic crystal structure and the hexagonal close-packed crystal structure occurs, a twin structure may be easily generated. Therefore, in the method of the present invention, by virtue of provision of an ion-bombarding energy that is sufficient to provide the metal film 3 with a strain energy higher than the stacking fault energy of the metal film 3, the metal film 3 can undergo plastic deformation. Since the strain energy is higher than the stacking fault energy, the plastic deformed metal film 3 that undergoes such plastic deformation releases the overall energy of its material system by virtue of the formation of the stacking faults in order to reduce the overall energy of the material system itself, thereby forming deformation twins in the metal film 3. It is noted that the overall energy of the material system of the metal film 3 undergoing plastic deformation may also be released by virtue of dislocation slip and dislocation climb. However, if the overall energy of the material system of the metal film 3 undergoing plastic deformation is released by virtue of the dislocation slip and dislocation climb, the probability of the generation of stacking faults would be correspondingly reduced. Further, it is noted that, when the metal film 3 undergoing plastic deformation is at a low temperature, the dislocation slip and dislocation climb can be effectively suppressed. Therefore, to prevent generation of an elevated temperature of the metal film 3 when the ion bombarding is performed, which results in an increase in the probability of dislocation slip and dislocation climb that reduce the probability of stacking faults, the film temperature (i.e., the temperature of the metal film 3) in the step (b) of the method of the present invention is controlled at a temperature lower than −20° C.

Preferably, the metal film in the step (a) is made of a material selected from the group consisting of copper, nickel, silver and gold. In an example of the present invention, the metal film in the step (a) is made of copper, and the deformation twins formed in the step (b) have an average twin spacing that ranges from 8.3 nm to 45.6 nm.

Moreover, to ensure the deformation twins can be distributed uniformly in the metal film 3 and the average spacing of the deformation twins can be reduced, in the case where the metal film 3 is made of copper, preferably, the film temperature in the step (b) ranges from −25° C. to −125° C. and the ion-bombarding energy in the step (b) ranges from 4.0 KeV to 5.0 KeV. However, since different metals have different stacking fault energies, the ion-bombarding energy in step (b) should be dependent on the material of the metal film 3, and thus should not be limited in the range of 4.0 KeV to 5.0 KeV. For example, since the stacking fault energy of aluminum is higher than that of copper, when the metal film 3 is made of aluminum, the ion-bombarding energy in the step (b) may be higher than 5.0 KeV to ensure the deformation twins of the metal film 3 can be distributed uniformly.

Preferably, the film temperature is controlled using liquid nitrogen.

Preferably, the liquid nitrogen is contained in a Dewar chamber 5 and is introduced to the vacuum chamber 4 through a metal tube 6. The metal tube 6 is cooled as the liquid nitrogen passes therethrough and the cooled metal tube 6 is arranged so that the metal film 3 and the substrate 2 are placed thereon by virtue of a metal clamp 61 disposed on the metal tube 6. Thus, the metal film 3 is in contact with and is fixed on the metal tube 6, thereby cooling the metal film 3 to the desired film temperature. Alternatively, the metal film 3 may also be cooled to the film temperature by virtue of allowing the liquid nitrogen to flow to the metal film 3 through a plurality of through holes 62 formed in a metal wall of the metal tube 6. Preferably, the metal tube 6 and the metal clamp 61 are made from a metal material have a thermal conductivity greater than 270 W/mK. More preferably, the metal tube 6 and the metal clamp 61 have a thermal conductivity greater than 400 W/mK, which may be, for example, made of pure copper having a thermal conductivity of about 401 W/mK.

It is noted that, when performing in step (b) of the method of the present invention, the temperature at the Dewar chamber 5 and the temperature at the metal film 3 (i.e., film temperature) are separately measured, and the temperature of the Dewar chamber 5 is lower than that of the metal film 3 by about 50° C.

Further, it is noted that, when the ion bombarding is performed, the metal atoms on the surface of the metal film 3 will be sputtered out, thereby resulting in a decrease in the thickness of the metal film 3 as the time for ion bombarding is increased. Therefore, preferably, the metal film 3 in the step (a) has a first predetermined thickness that is large enough to leave a second predetermined thickness after the metal film 3 in the step (a) is subjected to the ion bombarding in the step (b).

It should be noted that the first predetermined thickness of the metal film 3 before the step (b) is performed and the second predetermined thickness of the metal film 3 after the step (b) is performed are determined based on the subsequent applications thereof. For example, for forming a copper wire, a copper seed layer may be previously formed on a device surface. Further, a copper layer with a 1 μm thickness (i.e., the first predetermined thickness) is formed on the copper seed layer by electrical plating. Next, the copper layer is ion bombarded to generate deformation twins in the copper layer, followed by chemical mechanical polishing (CMP) the copper layer. Finally, the polished copper layer is patterned to produce a copper wire. The thickness of the copper wire is required to be about 300 nm to about 400 nm. Therefore, when the method of the present invention is applied to a copper wire, the first predetermined thickness should be greater than 400 nm. However, the first predetermined thickness and the second predetermined thickness are not the technical features of the present invention and may vary depending on the subsequent application.

Also, it is noted that, to prevent the film temperature of the metal film 3 from increasing too fast as the ion bombarding is performed, which results in an increase in the probability of dislocation slip and dislocation climb in the metal film 3, the sputtering rate is controlled to decrease as the film temperature in the step (b) increases, and the ion bombarding is performed intermittently.

Comparative Example 1 (CE1)

A method for forming a metal film with twins was performed as follows.

First, a first copper layer with about 8 μm thickness and a second copper layer with about 20 μm thickness were deposited respectively on a first silicon oxide substrate and a second silicon oxide substrate by electrical plating. Next, the copper layers were placed in a vacuum chamber and then liquid nitrogen contained in a Dewar chamber was introduced to the vacuum chamber through a Cu tube with about 400 W/mK thermal conductivity. The Cu tube was connected to the Dewar chamber and the copper layers were disposed on the Cu tube. At this time, the copper layers were ion bombarded using an ion-bombarding energy of 5.0 KeV. In Comparative example 1 (CE1), the temperature of the Dewar chamber and the temperature of the copper layers (i.e., the film temperature) were 25° C. and 75° C., respectively. The sputtering rate of the ion bombarding was about 50 nm/min.

The first and second copper layers were subsequently used as the samples for analysis using transmission electron microscopy (TEM) and for hardness testing. To perform the transmission electron microscopy analysis for observing the twins structure, the first copper layer on the first silicon oxide substrate was previously removed from the first silicon oxide substrate before the ion bombarding was performed. The first copper layer was simply placed in the vacuum chamber and was then ion bombarded to reduce the thickness thereof to become transparent. To perform the hardness test by virtue of a nanoindenter and avoid the substrate effect resulting from the hardness test by the nanoindenter, the second copper layer was placed in the vacuum chamber together with the second silicon oxide substrate when the ion bombarding was performed, and the residual thickness of the second copper layer is 10000 nm after the ion bombarding was performed.

Comparative Example 2 (CE2)

The conditions for performing the ion-bombarding procedure in Comparative example 2 (CE2) were generally the same as those in Comparative example 1 (CE1). Comparative example 2 (CE2) and comparative example 1 (CE1) are different in that, in CE2, the temperature of the Dewar chamber was −25° C., the temperatures of the first copper layer and the second copper layer (i.e., the film temperatures) were 25° C.; and the sputtering rate of the ion bombarding was about 60 nm/min.

Example 1 (E1)

The conditions for performing the ion-bombarding procedure in Example 1 (E1) of a method for forming a metal film with twins according to the present invention were generally the same as those in Comparative example 1 (CE1). Example 1 (E1) and Comparative example 1 (CE1) are different in that, in E1, the temperature of the Dewar chamber was −75° C.; the film temperature for each of the first and second copper layers was −25° C.; and the sputtering rate of the ion bombarding was about 85 nm/min.

Example 2 (E2)

The conditions for performing the ion-bombarding procedure in Example 2 (E2) were generally the same as those in Comparative example 1 (CE1). Example 2 (E2) and Comparative example 1 (CE1) are different in that, in E2, the temperature of the Dewar chamber was −125° C.; the film temperature of each of the first and second copper layers was −75° C.; and the sputtering rate of the ion bombarding was about 90 nm/min.

Example 3 (E3)

The conditions for performing the ion-bombarding procedure in Example 3 (E3) were generally the same as those in Comparative example 1 (CE1). Example 3 (E3) and Comparative example 1 (CE1) are different in that, in E3, the temperature of the Dewar chamber was −175° C.; the film temperature of each of the first and second copper layers was −125° C.; and the sputtering rate of the ion bombarding was about 100 nm/min.

Example 4 (E4)

The conditions for performing the ion-bombarding procedure in Example 4 (E4) were generally the same as those in Example 3 (E3). Example 4 (E4) and Example 3 (E3) are different in that, in E4, the sputtering rate of the ion-bombarding energy was 4 KeV.

<Analysis>

Figure 2:
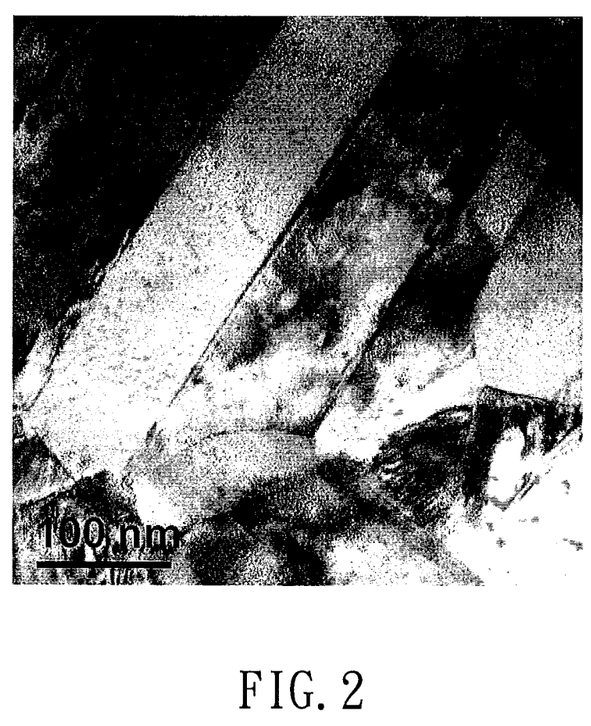
FIG. 2 is a transmission electron microscope image illustrating a microstructure of a first copper layer in Comparative example 1 (CE1)

It can be seen from the transmission electron microscopy image shown in FIG. 2 that the twin spacing of the deformation twins in the first copper layer of CE1 at a film temperature of 75° C. and with an ion-bombarding energy of 5 KeV is about 45 to 90 nm, and the deformation twins in CE1 are not distributed uniformly.

Figure 3:
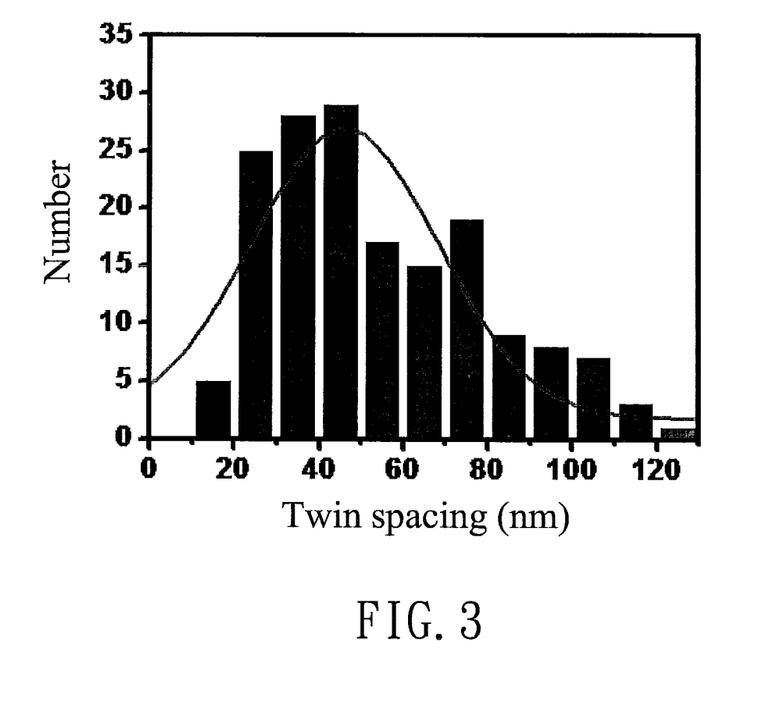
FIG. 3 is a diagram illustrating an average twin spacing distribution of the first copper layer in CE1.

Statistical measurement of the twin spacing of the first copper layer in CE1 was performed by selecting randomly 200 copper grains from the transmission electron microscopy image, and calculating the average twin spacing of the 200 copper grains. It can be seen from the twin spacing distribution diagram of FIG. 3 that the deformation twins in the first copper layer of CE1 have an average twin spacing of 54.4 nm, and the standard deviation is ±26.2 nm.

Figure 4:
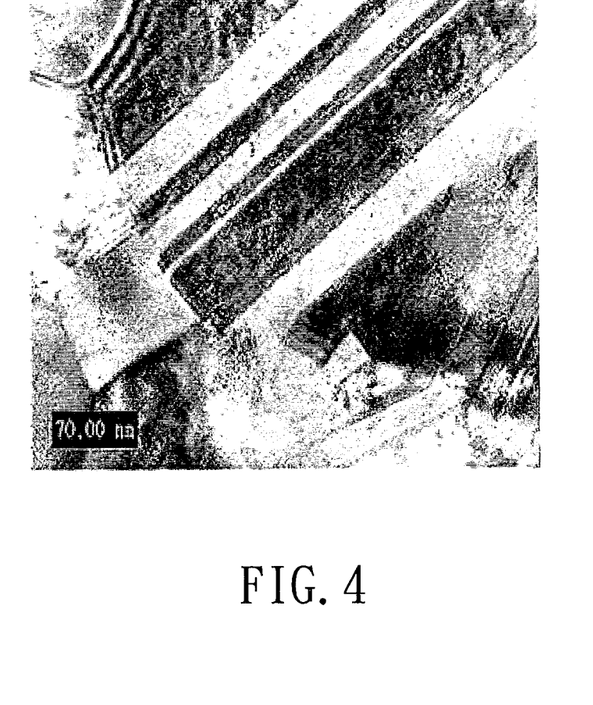
FIG. 4 is a transmission electron microscope image illustrating a microstructure of a first copper layer in Comparative example 2 (CE2)

It can be seen from the transmission electron microscopy image shown in FIG. 4 that the twin spacing of the deformation twins in the first copper layer of CE2 at a film temperature of 25° C. and with an ion-bombarding energy of 5 KeV is about 45 nm, and the deformation twins are not distributed uniformly.

Figure 5:
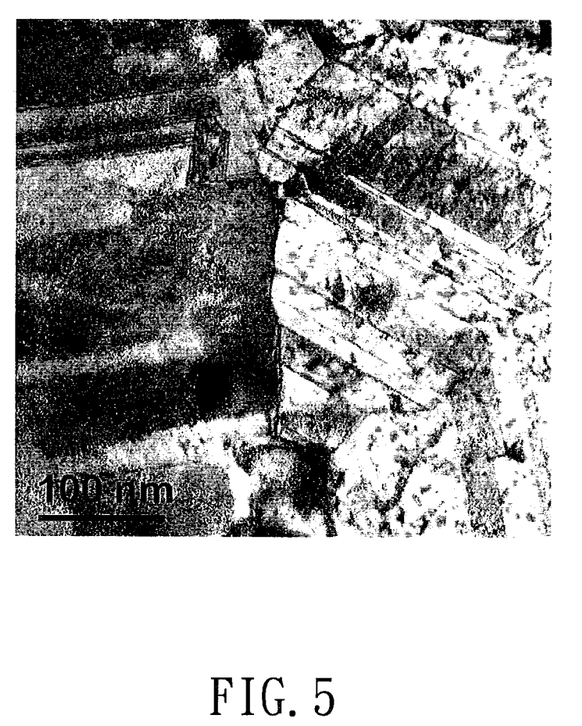

It can be seen from the transmission electron microscopy image shown in FIG. 5 that the twin spacing of the deformation twins in the first copper layer of E1 at a film temperature of −25° C. and with an ion-bombarding energy of 5 KeV is about 35 nm.

Figure 6:
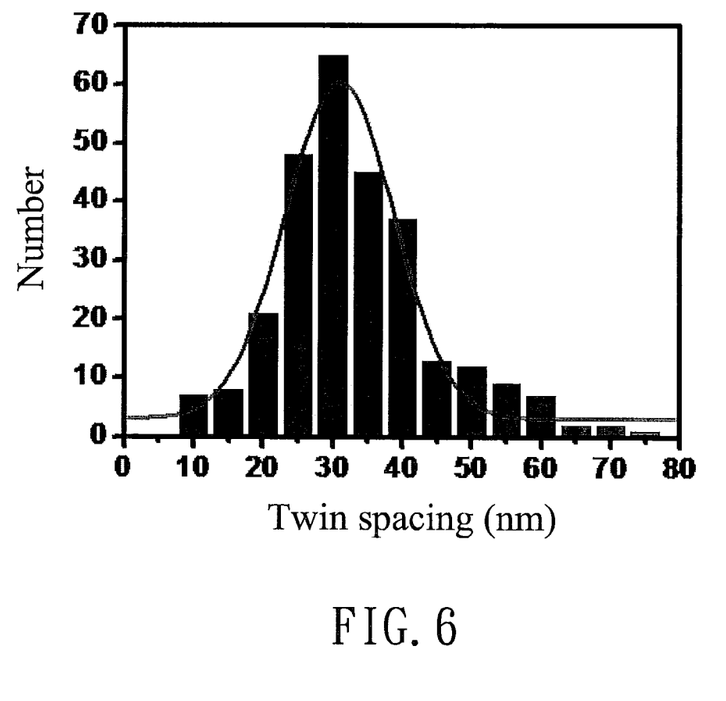
FIG. 6 is a diagram illustrating an average twin spacing distribution of the first copper layer in E1.

It can be seen from the twin spacing distribution diagram of FIG. 6 that the deformation twins in the first copper layer of E1 have an average twin spacing of 33.4 nm, and the standard deviation is ±12.2 nm.

Figure 7:
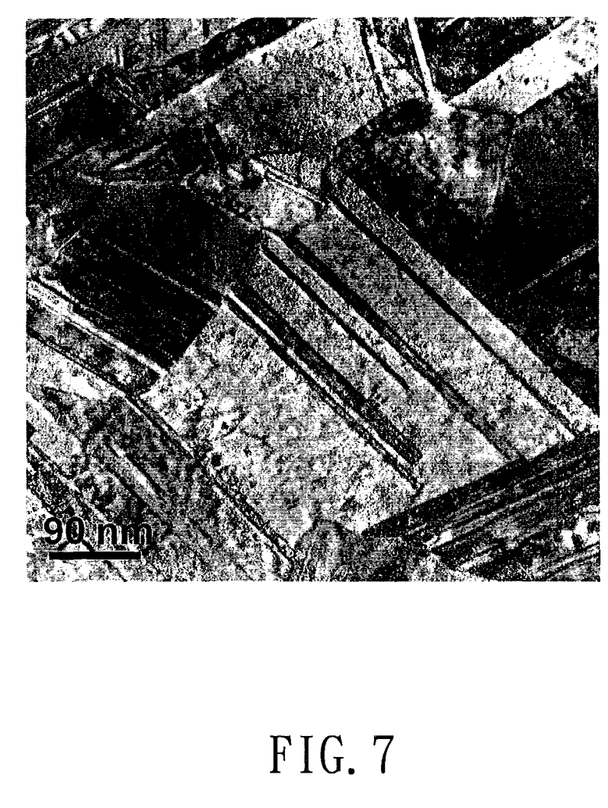
FIG. 7 is a transmission electron microscope image illustrating a microstructure of a first copper layer in Example 2 (E2) of a method for forming a metal film with twins according to the present invention.

It can be seen from the transmission electron microscopy image shown in FIG. 7 that the twin spacing of the deformation twins in the first copper layer of E2 at a film temperature of −75° C. and with an ion-bombarding energy of 5 KeV is about 30 nm.

Figure 8:
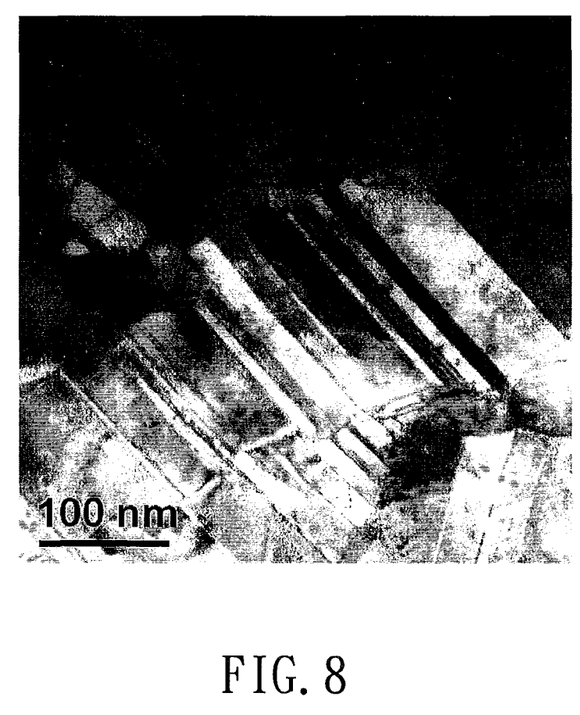
FIG. 8 is a transmission electron microscope image illustrating a microstructure of a first copper layer in Example 3 (E3) of a method for forming a metal film with twins according to the present invention.

It can be seen from the transmission electron microscopy image shown in FIG. 8 that the twin spacing of the deformation twins in the first copper layer of E3 at a film temperature of −125° C. and with an ion-bombarding energy of 5 KeV is about 25 nm.

Figure 9:
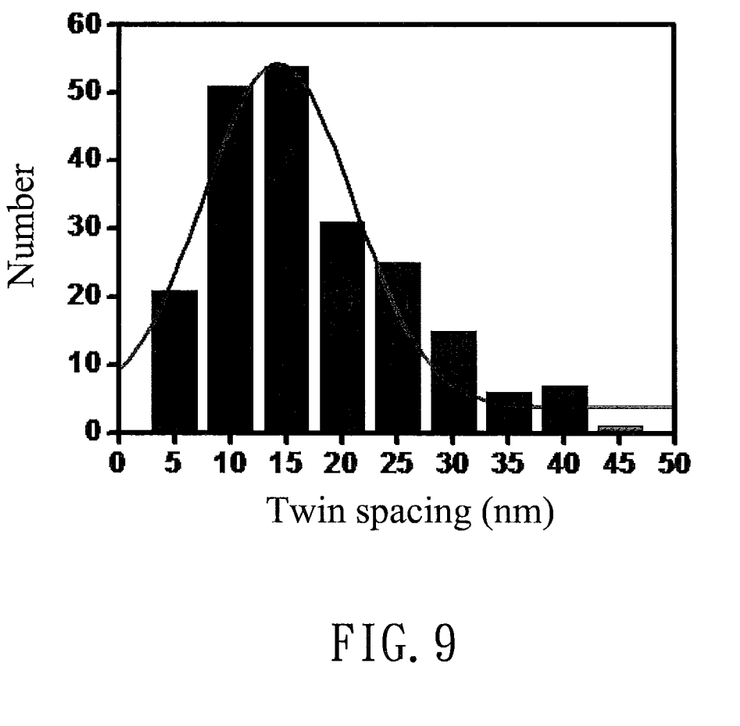
FIG. 9 is a diagram illustrating an average twin spacing distribution of the first copper layer in E3 of the present invention.

It can be seen from the twin spacing distribution diagram of FIG. 9 that the deformation twins in the first copper layer of E3 have an average twin spacing of 17.5 nm, and the standard deviation is ±9.2 nm.

Figure 10:
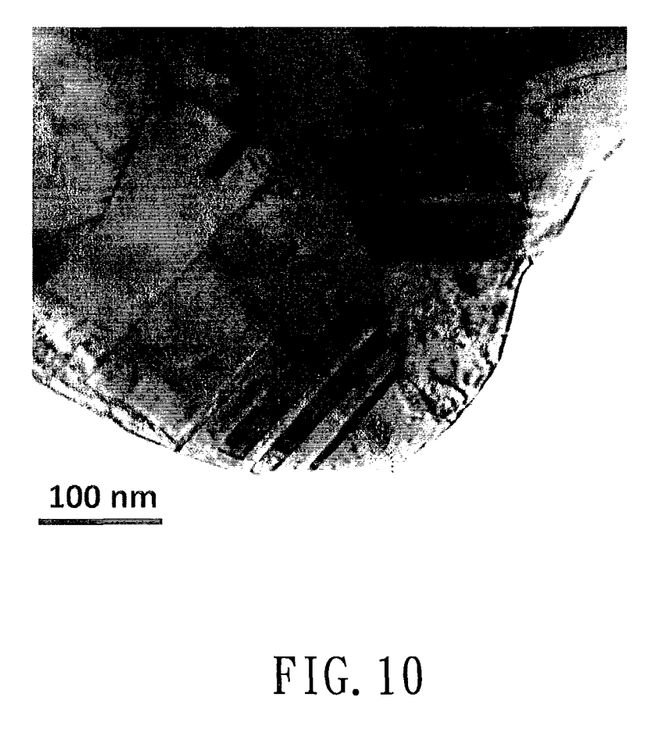
FIG. 10 is a transmission electron microscope image illustrating a microstructure of a first copper layer in Example 4 (E4) of a method for forming a metal film with twins according to the present invention.

It can be seen from the transmission electron microscopy image shown in FIG. 10 that the twin spacing of the deformation twins in the first copper layer of E4 at a film temperature of −125° C. and with an ion-bombarding energy of 4 KeV is about 35 nm.

<Hardness Testing>

Hardness for each of the second copper layers in CE1, CE2, and E1 to E4 was measured using a nanoindenter. Hardness testing was performed by pressing a probe of the nanoindenter against a surface of the copper layer at a loading rate of 1 mN/sec to make an indentation, and, when the depth of the indentation reaches 100 nm, retracting the probe at an unloading rate of 1 mN/sec. The results, the process parameters, and the twin spacing are collectively shown in the following Table 1.

TABLE 1

| Example No. | Film temperature (°C.) | Ion-bombarding energy (KeV) | Average twin spacing (nm) | Hardness (GPa) |
|---|---|---|---|---|
| CE1 | 75 | 5 | 54.4 ± 26.6 | 2.0 |
| CE2 | 25 | 5 | — | — |
| E1 | −25 | 5 | 33.4 ± 12.2 | 2.8 |
| E2 | −75 | 5 | — | — |
| E3 | −125 | 5 | 17.5 ± 9.2 | 3.6 |
| E4 | −125 | 4 | — | 3.4 |

It can be seen from Table 1 that when the film temperature decreases, the average twin spacing of the deformation twins of the first copper layer decreases while the hardness of the second copper layer is increased. For a copper wire used in the semiconductor field, such high hardness is sufficient to prevent undesirable electromigration phenomenon, thereby enhancing the reliability of a semiconductor device.

By virtue of ion bombarding and adjusting the film temperature to control the twin spacing of the copper layers, a copper film with twins having a thickness smaller than 500 nm can be obtained. Therefore, the method for forming a metal film with twins is more suitable for use in the semiconductor field as compared to the methods disclosed by C. J. Shute et al and C. Zang et al.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

What is claimed is:

1. A method for forming a metal film with twins, comprising:
   (a) forming a metal film over a substrate, the metal film being made of a material having one of a face-centered cubic crystal structure and a hexagonal close-packed crystal structure; and
   (b) ion bombarding the metal film at a film temperature lower than −20° C. in a vacuum chamber and with an ion-bombarding energy sufficient to cause plastic deformation of the metal film to generate deformation twins in the metal film.

2. The method of claim 1, wherein the metal film in step (a) is made of a material selected from the group consisting of copper, nickel, silver and gold.

3. The method of claim 2, wherein the metal film in step (a) is made of copper.

4. The method of claim 3, wherein the film temperature ranges from −25° C. to −125° C.

5. The method of claim 3, wherein the ion-bombarding energy ranges from 4.0 KeV to 5.0 KeV.

6. The method of claim 3, wherein the deformation twins formed in step (b) have an average twin spacing that ranges from 8.3 nm to 45.6 nm.

7. The method of claim 1, wherein the film temperature is controlled using liquid nitrogen.

8. The method of claim 7, wherein the liquid nitrogen is introduced to the vacuum chamber through a metal tube, the metal tube being in contact with the metal film and having a thermal conductivity greater than 270 W/mK.

* * * * *